United States Patent
Kikuchi

(10) Patent No.: US 8,330,243 B2
(45) Date of Patent: Dec. 11, 2012

(54) SEMICONDUCTOR LIGHT-RECEIVING ELEMENT AND OPTICAL MODULE

(75) Inventor: Matobu Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 201 days.

(21) Appl. No.: 13/017,072

(22) Filed: Jan. 31, 2011

(65) Prior Publication Data

US 2011/0297967 A1 Dec. 8, 2011

(30) Foreign Application Priority Data

Jun. 3, 2010 (JP) .................................. 2010-127802

(51) Int. Cl.
*H01L 31/101* (2006.01)
*H01L 31/12* (2006.01)
*H01L 31/153* (2006.01)

(52) U.S. Cl. ........ 257/432; 257/436; 257/437; 257/459; 257/466; 257/E31.12; 257/E31.13; 257/E31.095; 257/E31.101; 257/E31.128

(58) Field of Classification Search .................. 257/184, 257/431, 432, 436, 437, 459, 461, 466, E31.12, 257/E31.13, E31.095, E31.101, E31.128
See application file for complete search history.

(56) References Cited

U.S. PATENT DOCUMENTS

| | | | |
|---|---|---|---|
| 5,107,318 A | | 4/1992 | Makiuchi et al. |
| 5,345,074 A | * | 9/1994 | Tonai et al. ................. 250/214.1 |
| 5,412,249 A | | 5/1995 | Hyugaji et al. |
| 6,043,550 A | | 3/2000 | Kuhara et al. |
| 6,437,415 B1 | | 8/2002 | Kuhara et al. |
| 6,488,419 B2 | * | 12/2002 | Kato et al. ....................... 385/93 |
| 6,784,512 B2 | * | 8/2004 | Yamaguchi et al. .......... 257/440 |
| 6,847,053 B2 | * | 1/2005 | Kuhara et al. .................... 257/82 |
| 6,888,857 B2 | * | 5/2005 | Takagi et al. .................... 372/32 |
| 7,620,090 B2 | * | 11/2009 | Ueda et al. ................. 372/50.21 |
| 2005/0078724 A1 | * | 4/2005 | Massara et al. .................. 372/45 |
| 2007/0001254 A1 | * | 1/2007 | Inada ............................ 257/461 |

(Continued)

FOREIGN PATENT DOCUMENTS

JP 3-296279 A 12/1991

(Continued)

OTHER PUBLICATIONS

Korean Intellectual Property Office, Office Action in Korean Patent Application No. 10-2011-0052557 (Aug. 27, 2012).

*Primary Examiner* — Evan Pert
(74) *Attorney, Agent, or Firm* — Leydig, Voit & Mayer, Ltd.

(57) ABSTRACT

A semiconductor light-detecting element includes: a semiconductor substrate of a first conductivity type having a band gap energy, a first principal surface, and a second principal surface opposed to the first principal surface; a first semiconductor layer of the first conductivity type on the first principal surface and having a band gap energy smaller than the band gap energy of the semiconductor substrate; a second semiconductor layer of the first conductivity type on the first semiconductor layer; an area of a second conductivity type on a part of the second semiconductor layer; a first electrode connected to the second semiconductor layer; a second electrode connected to the area; and a low-reflection film on the second principal surface. The second principal surface is a light-detecting surface detecting incident light, and no substance or structure having a higher reflection factor, with respect to the incident light, than the low-reflection film, is located on the second principal surface.

6 Claims, 5 Drawing Sheets

U.S. PATENT DOCUMENTS

| | | | |
|---|---|---|---|
| 2007/0104242 A1* | 5/2007 | Kudo et al. | 372/96 |
| 2011/0220971 A1* | 9/2011 | Haddad et al. | 257/228 |

FOREIGN PATENT DOCUMENTS

| | | |
|---|---|---|
| JP | 6-291079 A | 10/1994 |
| JP | 11-17211 A | 1/1999 |
| JP | 2000-12889 A | 1/2000 |
| JP | 2000-36615 A | 2/2000 |
| JP | 2006-147991 A | 6/2006 |
| KR | 10-2009-0050756 A | 5/2009 |

* cited by examiner

SEMICONDUCTOR LIGHT-RECEIVING ELEMENT AND OPTICAL MODULE

BACKGROUND OF THE INVENTION

1. Field of the Invention

The present invention relates to a semiconductor light-emitting element and an optical module which make it possible to prevent any returning light defect.

2. Background Art

In optical modules used for optical communication, a semiconductor light-receiving element that monitors an amount of light emitted from a semiconductor light-emitting element such as a laser diode is disposed opposed to the back of the semiconductor light-emitting element (e.g., see paragraph 0007 of Japanese Patent Laid-Open No. 2000-36615).

SUMMARY OF THE INVENTION

In conventional semiconductor light-receiving elements, a condensing lens and an electrode or the like are provided on the light-receiving surface of incident light. The incident light is reflected by the condensing lens and electrode or the like and the reflected light returns to the semiconductor light-emitting element. There have been problems that the reflected light interferes with the incident light or a monitor current of the semiconductor light-emitting element decreases (returning light defect).

In view of the above-described problems, an object of the present invention is to provide a semiconductor light-emitting element and an optical module which make it possible to prevent any returning light defect.

According to the present invention, a semiconductor light-receiving element comprises: a semiconductor substrate of a first conductivity type having a first principal surface and a second principal surface opposed to each other; a first semiconductor layer of the first conductivity type on the first principal surface of the semiconductor substrate and having a band gap smaller than a band gap of the semiconductor substrate; a second semiconductor layer of the first conductivity type on the first semiconductor layer; a semiconductor area of a second conductivity type on a part of the second semiconductor layer; a first electrode connected to the second semiconductor layer; a second electrode connected to the semiconductor area; and a low-reflection film on the second principal surface of the semiconductor substrate, wherein the second principal surface of the semiconductor substrate is a light-receiving surface of an incident light, and No substance or structure having a higher reflection factor with respect to the incident light than a reflection factor of the low-reflection film is provided on the second principal surface of the semiconductor substrate.

The present invention makes it possible to prevent any returning light defect.

Other and further objects, features and advantages of the invention will appear more fully from the following description.

DETAILED DESCRIPTION OF THE PREFERRED EMBODIMENTS

A semiconductor light-emitting element and an optical module according to the embodiments of the present invention will be described with reference to the drawings. The same components will be denoted by the same symbols, and the repeated description thereof may be omitted.

First Embodiment

Figure 1:
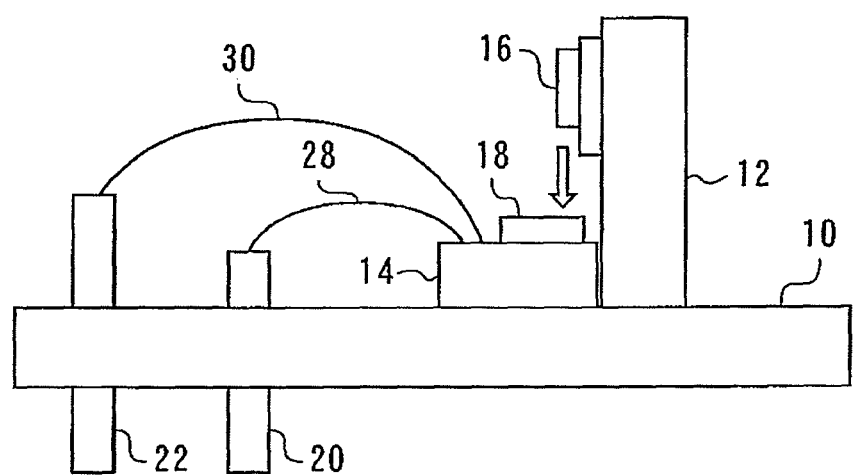
FIG. 1 is a cross-sectional view illustrating an optical module according to the first embodiment.

FIG. 1 is a cross-sectional view illustrating an optical module according to the first embodiment. Bases 12 and 14 are mounted on a stem 10. A semiconductor light-emitting element 16 is connected to one side of the base 12. A semiconductor light-receiving element 18 such as a laser diode is connected to the base 14. The semiconductor light-receiving element 18 is disposed opposed to the back of the semiconductor light-emitting element 16 and receives backlight emitted from the back of the semiconductor light-emitting element 16 as incident light. Lead pins 20 and 22 penetrate the stem 10.

Figure 2:
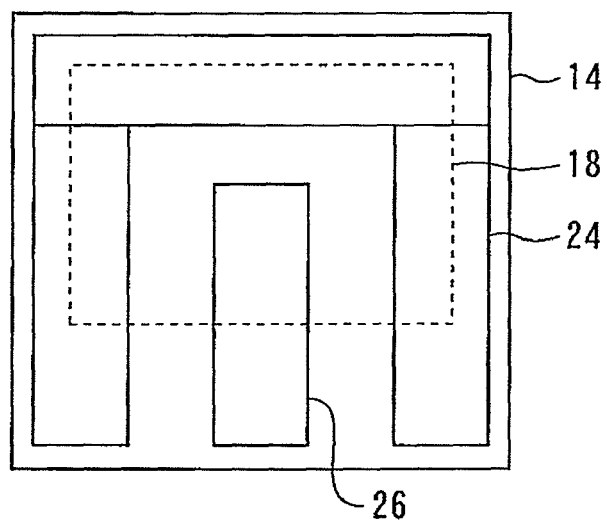
FIG. 2 is a top view illustrating a base for the semiconductor light-receiving element according to the first embodiment.

FIG. 2 is a top view illustrating a base for the semiconductor light-receiving element according to the first embodiment. Wirings 24 and 26 are provided on the top surface of the base 14. The wirings 24 and 26 are connected to the lead pins 20 and 22 via wires 28 and 30 respectively.

Figure 3:
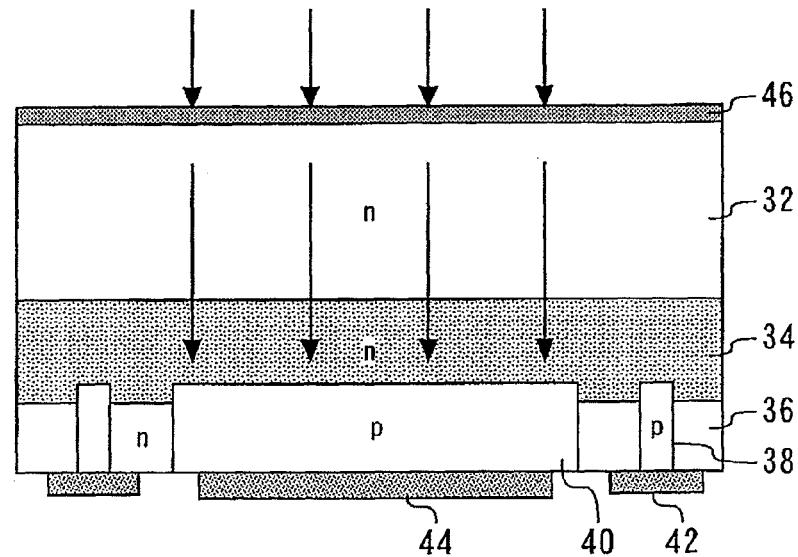
FIG. 3 is a cross-sectional view illustrating the semiconductor light-receiving element according to the first embodiment.

FIG. 3 is a cross-sectional view illustrating the semiconductor light-receiving element according to the first embodiment. An n-type InP substrate 32 has a surface (first principal surface) and a back surface (second principal surface) opposed to each other. An n-type InGaAs layer 34 is provided on the surface of the n-type InP substrate 32. The n-type InGaAs layer 34 has a band gap smaller than that of the n-type InP substrate 32.

An n-type InP layer 36 is provided on the n-type InGaAs layer 34. There are p-type regions 38 and 40 on parts of the n-type InP layer 36.

A cathode electrode 42 is connected to the n-type InP layer 36 and the p-type region 38 and an anode electrode 44 is connected to the p-type region 40. The cathode electrode 42 and the anode electrode 44 are made up of a Ti film and an Au film formed thereon. The cathode electrode 42 and the anode electrode 44 of the semiconductor light-receiving element 18 are connected to the wirings 24 and 26 respectively by solder.

The presence of the p-type region 38 is not essential. However, when the p-type region 38 is provided short-circuited with the n-type InP layer 36 around the cathode electrode 42 and set to the same potential, slow response carriers can be eliminated, and the response speed is thereby increased.

A low-reflection film 46 made of SiN is provided on the back surface of the n-type InP substrate 32. The back surface of the n-type InP substrate 32 is the light-receiving surface of the incident light. No substance or structure such as a condensing lens, electrode or difference in level having a higher reflection factor with respect to the incident light than that of the low-reflection film 46 is provided on the back surface of the n-type InP substrate 32.

Figure 4:
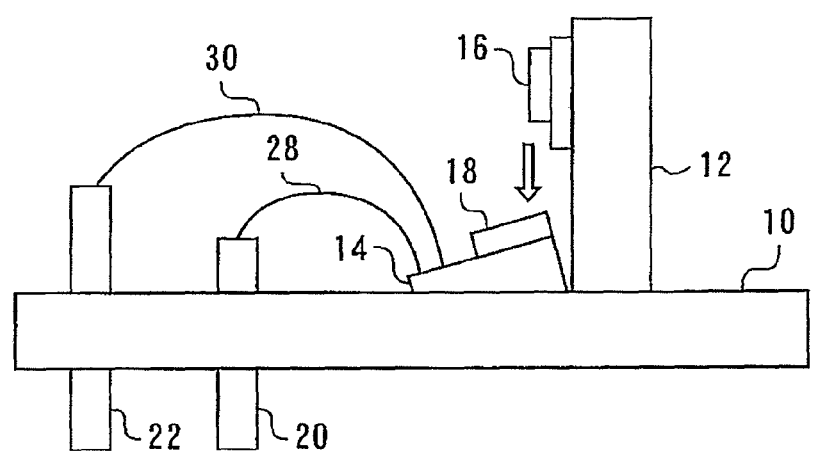
FIG. 4 is a cross-sectional view illustrating an optical module according to a comparative example.

Effects of the present embodiment will be described in comparison with comparative examples. FIG. 4 is a cross-sectional view illustrating an optical module according to a comparative example. In the comparative example, the top surface of the base 14 is diagonally cut to prevent any returning light defect. On the other hand, since measures are taken against the returning light defect for the semiconductor light-receiving element 18 in the present embodiment, the base 14 need not be cut diagonally. It is thereby possible to reduce manufacturing costs.

Figure 5:
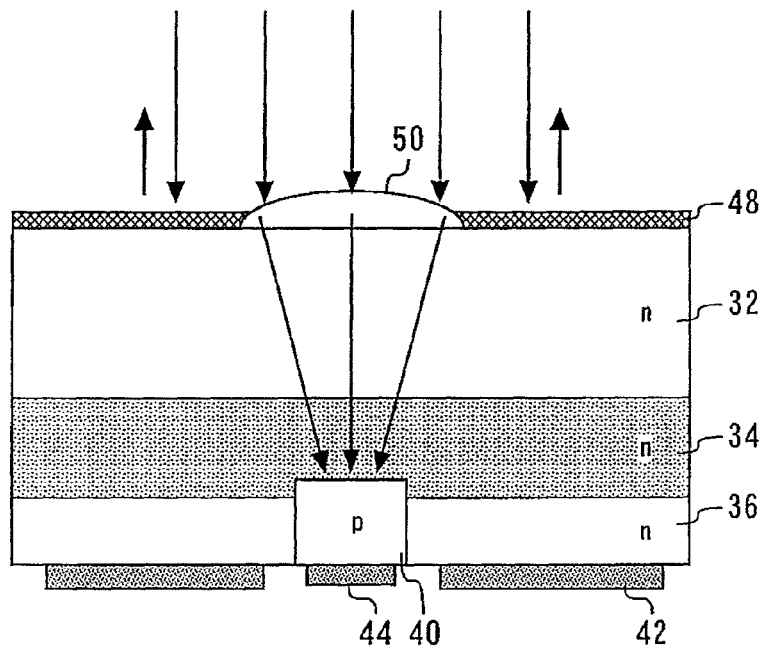
FIG. 5 is a cross-sectional view illustrating a back surface incident-type semiconductor light-receiving element according to comparative example 1.

FIG. 5 is a cross-sectional view illustrating a back surface incident-type semiconductor light-receiving element according to comparative example 1. In comparative example 1, a light-shielding mask 48 and a condensing lens 50 are provided on the back surface of the n-type InP substrate 32 which is the light-receiving surface. The light-shielding mask 48 reflects incident light deviating from the light-receiving section, and can thereby cut slow response components. Therefore, comparative example 1 is useful for applications demanding higher response speed. However, when used for a monitor of the semiconductor light-emitting element 16, a returning light defect becomes problematic. On the other hand, since no light-shielding mask 48 or condensing lens 50 is provided on the light-receiving surface in the present embodiment, any returning light defect can be prevented.

Figure 6:
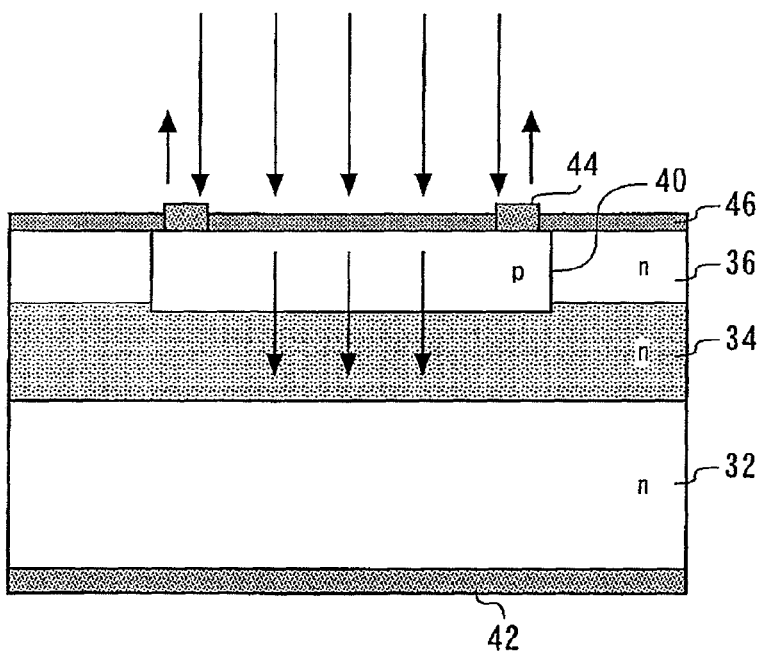
FIG. 6 is a cross-sectional view illustrating a surface incident-type semiconductor light-receiving element according to comparative example 2.

FIG. 6 is a cross-sectional view illustrating a surface incident-type semiconductor light-receiving element according to comparative example 2. In comparative example 2, a ring-shaped anode electrode 44 is provided on the p-type region 40 which is the light-receiving surface. The anode electrode 44 reflects incident light, and therefore a returning light defect becomes problematic. On the other hand, since no electrode is provided on the light-receiving surface in the present embodiment, any returning light defect can be prevented. Furthermore, since there is no electrode on the light-receiving surface, it is possible to provide a wider light-receiving section than the surface incident-type and thereby increase the monitor current.

Figure 7:
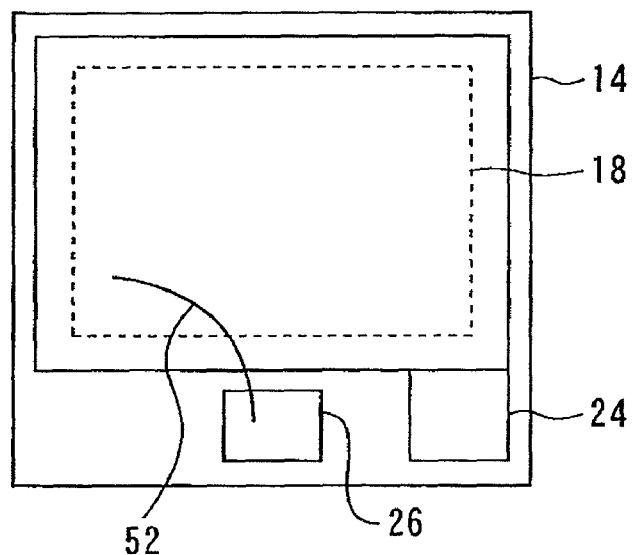
FIG. 7 is a top view illustrating a base for a semiconductor light-receiving element according to comparative example 2.

FIG. 7 is a top view illustrating a base for a semiconductor light-receiving element according to comparative example 2. In comparative example 2, the anode electrode 44 on the semiconductor light-receiving element 18 and the wiring 26 on the base 14 need to be connected via a wire 52. On the other hand, the present embodiment completes assembly of the chip by only bonding the cathode electrode 42 and the anode electrode 44 of the semiconductor light-receiving element 18 to the wirings 24 and 26 on the base 14 by solder, and can thereby eliminate the necessity of a step of wire bonding to the semiconductor light-receiving element 18. Moreover, breakage of semiconductor light-receiving element 18 by wire bonding is eliminated.

As described so far, the present embodiment provides no substance or structure of a higher reflection factor with respect to incident light than the low-reflection film 46 such as a light-shielding mask, condensing lens, difference in level on the back surface of the n-type InP substrate 32 which is the light-receiving surface. Therefore, it is possible to prevent any returning light defect.

Second Embodiment

Figure 8:
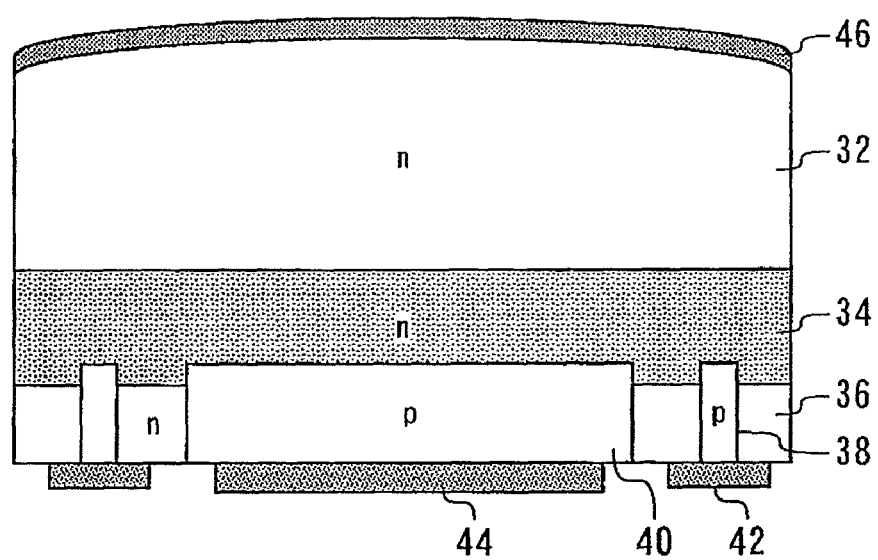
FIG. 8 is a cross-sectional view illustrating a semiconductor light-receiving element according to the second embodiment.

FIG. 8 is a cross-sectional view illustrating a semiconductor light-receiving element according to the second embodiment. The back surface of the n-type InP substrate 32 is curved surface. This further reduces reflected light reflected by the back surface of the n-type InP substrate 32 and returned to the semiconductor light-receiving element, and can thereby further reliably prevent any returning light defect.

Third Embodiment

Figure 9:
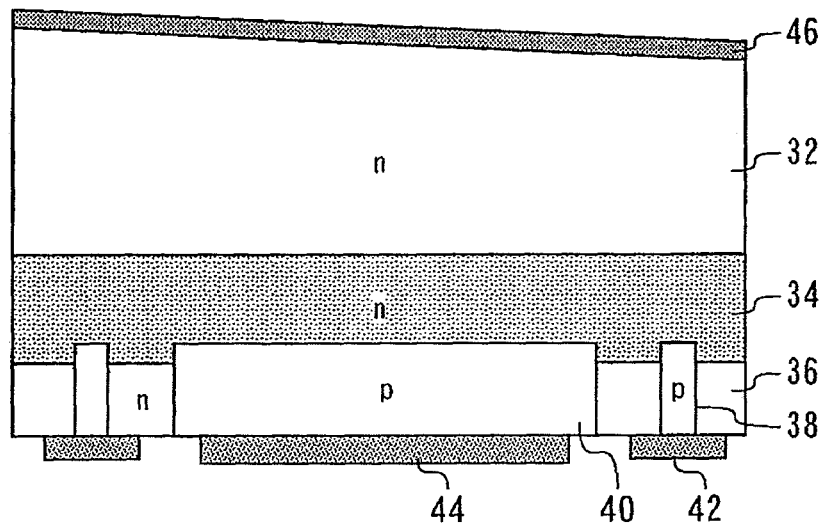
FIG. 9 is a cross-sectional view illustrating a semiconductor light-receiving element according to the third embodiment.

FIG. 9 is a cross-sectional view illustrating a semiconductor light-receiving element according to the third embodiment. The back surface of the n-type InP substrate 32 is diagonally cut and inclined with respect to the incident direction of incident light. This further reduces reflected light reflected by the back surface of the n-type InP substrate 32 and returned to the semiconductor light-receiving element, and can thereby further reliably prevent any returning light defect.

Fourth Embodiment

Figure 10:
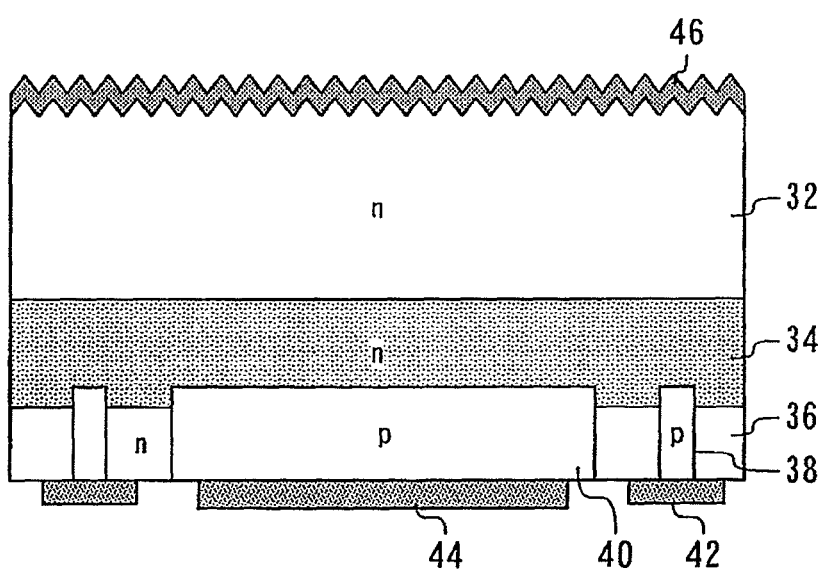
FIG. 10 is a cross-sectional view illustrating a semiconductor light-receiving element according to the fourth embodiment.

FIG. 10 is a cross-sectional view illustrating a semiconductor light-receiving element according to the fourth embodiment. The back surface of the n-type InP substrate 32 is rougher than the surface of the n-type InP substrate 32 or the surface of the n-type InP layer 36 or the like. This further reduces reflected light reflected by the back surface of the n-type InP substrate 32 and returned to the semiconductor light-receiving element, and can thereby further reliably prevent any returning light defect.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-127802, filed on Jun. 3, 2010 including specification, claims, drawings and summary, on which the Convention priority of the present application is based, are incorporated herein by reference in its entirety.

What is claimed is:

1. A semiconductor light-detecting element comprising:
   a semiconductor substrate of a first conductivity type, the semiconductor substrate having a first principal surface, a second principal surface opposed to the first principal surface, and a band gap energy;
   a first semiconductor layer of the first conductivity type on the first principal surface of the semiconductor substrate and having a band gap energy smaller than the band gap energy of the semiconductor substrate;
   a second semiconductor layer of the first conductivity type on the first semiconductor layer;
   an area of a second conductivity type on a part of the second semiconductor layer;
   a first electrode connected to the second semiconductor layer;
   a second electrode connected to the area; and
   a low-reflection film on the second principal surface of the semiconductor substrate, wherein the second principal surface of the semiconductor substrate is a light-detecting surface on which incident light that is detected is incident, and no substance or structure having a higher reflection factor, with respect to the incident light, than reflection factor of the low-reflection film, is located on the second principal surface of the semiconductor substrate.

2. The semiconductor light-detecting element according to claim 1, wherein the second principal surface is curved in cross-section.

3. The semiconductor light-detecting element according to claim 1, wherein the second principal surface is inclined with respect to direction of incidence of the incident light.

4. The semiconductor light-detecting element according to claim 1, wherein the second principal surface is rougher than the first principal surface.

5. An optical module comprising:

a semiconductor light-emitting element; and the semiconductor light-detecting element according to claim 1, wherein the semiconductor light-detecting element is disposed opposite a back of the semiconductor light-emitting element and detects backlight emitted from the back of the semiconductor light-emitting element, as the incident light.

6. The optical module according to claim 5, further comprising:

a base;

first wiring on the base and connected to the first electrode of the semiconductor light-detecting element; and second wiring on the base and connected to the second electrode of the semiconductor light-detecting element.

* * * * *